(12) United States Patent  (10) Patent No.: US 6,276,590 B1
Nakazato  (45) Date of Patent: Aug. 21, 2001

(54) CONDUCTIVE BALL ATTACHING APPARATUS AND METHOD

(75) Inventor: Shinichi Nakazato, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/514,463

(22) Filed: Feb. 28, 2000

Related U.S. Application Data

(62) Division of application No. 09/063,711, filed on Apr. 21, 1998, now Pat. No. 6,070,783.

(30) Foreign Application Priority Data

Apr. 22, 1997 (JP) .................................................. 9-104458

(51) Int. Cl.[7] .............................. B23K 1/00; B23K 5/00; B23K 20/14; B23K 13/08; B23K 5/22
(52) U.S. Cl. .................................. 228/41; 228/8; 228/19; 228/20.1
(58) Field of Search .................................... 228/105, 246, 228/56.5, 245, 248.1, 41, 8, 19, 20.1, 47.1; 250/559.4

(56) References Cited

U.S. PATENT DOCUMENTS

| 4,342,090 | 7/1982 | Caccoma et al. . | |
| 4,765,525 | * 8/1988 | Popp et al. | 228/9 |
| 4,817,849 | * 4/1989 | Yamamoto et al. | 228/103 |
| 5,249,491 | * 10/1993 | Carter | 83/13 |
| 5,279,045 | * 1/1994 | Odashima et al. | 34/10 |
| 5,601,229 | 2/1997 | Nakazato et al. . | |
| 5,615,823 | * 4/1997 | Noda et al. | 228/103 |
| 5,628,660 | * 5/1997 | Onitsuka | 445/24 |
| 5,667,129 | * 9/1997 | Morita et al. | 228/102 |
| 5,680,984 | * 10/1997 | Sakemi | 228/246 |
| 5,741,410 | 4/1998 | Tsurushima . | |
| 5,788,143 | 8/1998 | Boyd et al. . | |
| 5,867,260 | * 2/1999 | Sakai | 356/237 |
| 5,956,134 | * 9/1999 | Roy et al. | 356/237.5 |

* cited by examiner

Primary Examiner—Tom Dunn
Assistant Examiner—Zidia Pittman
(74) Attorney, Agent, or Firm—Pearne & Gordon LLP

(57) ABSTRACT

An apparatus and a method for attaching conductive balls by which the tact time necessary for the positional recognition of a substrate before the conductive balls are attached onto a substrate can be greatly reduced. A first camera and a second camera are moved together a suction head. After the suction head picks up the conductive balls in a conductive ball supply section, the suction head is moved to a position above a flux supply section so that flux can be attached to the conductive balls 10, and concurrently the first camera recognizes a positional recognition mark on a substrate. Then, during when the suction head is moved to a position above the substrate, the second camera recognizes another positional recognition mark on the substrate. In accordance with the positional recognition conducted above, the suction head is positioned accurately with respect to the substrate, and then the conductive balls are attached onto the electrodes on the substrate.

27 Claims, 4 Drawing Sheets

CONDUCTIVE BALL ATTACHING APPARATUS AND METHOD

CROSS REFERENCE TO RELATED APPLICATIONS

The present application is a division of U.S. patent application Ser. No. 09/063,711, now U.S. Pat. No. 6,070,783 filed Apr. 21, 1998.

BACKGROUND OF THE INVENTION

The present invention relates to an apparatus and a method for attaching conductive balls forming bumps onto a substrate. A method of using conductive balls for forming electrodes on a substrate on which electronic parts is known. According to this method, after conductive balls, such as solder balls, have been attached onto electrodes on a substrate, the conductive balls are heated so that bumps (protruding electrodes) are formed on the electrodes.

Concerning the method for attaching the conductive balls onto the electrodes on the substrate, a method of using a suction head is known. According to this method, the conductive balls are vacuum-absorbed and held onto a lower surface of the suction head and attached onto the electrodes on the substrate. This method is advantageous in that a large number of conductive balls can be effectively attached onto a large number of electrodes all at once.

In the case where the-conductive balls are attached onto the substrate by the suction head, it is necessary to accurately position the conductive balls to the electrodes on the substrate. Therefore, before the conductive balls are attached onto the substrate, positional recognition of the substrate is required. Conventionally, in the suction head, there is provided one set of camera used for positional recognition of the substrate. While the camera used for positional recognition is moved in the horizontal direction integrally with the suction head, positional recognition marks formed on an upper surface of the substrate are observed by the camera.

There are provided two positional recognition marks on the substrate. In order to enhance the positional recognition accuracy of the substrate, these positional recognition marks are formed at two positions on a diagonal line of the substrate, and a distance between the two positional recognition marks is extended as long as possible. Accordingly, when the conventional apparatus is used, the camera must be horizontally moved by a long distance and these two positional recognition marks must be successively observed by the camera. Therefore, the tact time required for the positional recognition of the substrate is extended, and the productivity can not be enhanced.

Especially, positional recognition of the substrate must be conducted individually for a large number of substrates. Since the size of the substrate is increased recently and a distance between the two positional recognition marks is increased, the tact time is extended for the positional recognition of the substrate, and it becomes impossible to enhance the productivity.

SUMMARY OF THE INVENTION

Consequently, it is an object of the present invention to provide an apparatus and a method for attaching conductive balls by which the tact time necessary for the positional recognition of a substrate can be greatly reduced.

To attain the above-noted object, the present invention provides a conductive ball attaching apparatus and a conductive ball attaching method, wherein a pair of first and second cameras are provided for a suction head to respectively recognize two position recognition marks formed on a substrate.

As described above, according to the present invention, after a mutual positional relation between the first and the second camera has been recognized, the first and the second camera respectively recognize the position recognition marks formed at two positions on the substrate, which are arranged being distant from each other, during the movement or operation of the suction head. Therefore, the tact time required for this positional recognition can be greatly shortened and the conductive balls can be attached onto a large number of successively conveyed substrates with high workability.

DETAILED DESCRIPTION OF THE PREFERRED EMBODIMENTS

Preferred embodiment of the present invention will now be described with reference to the drawings attached hereto.

[Embodiment 1]

Figure 1:
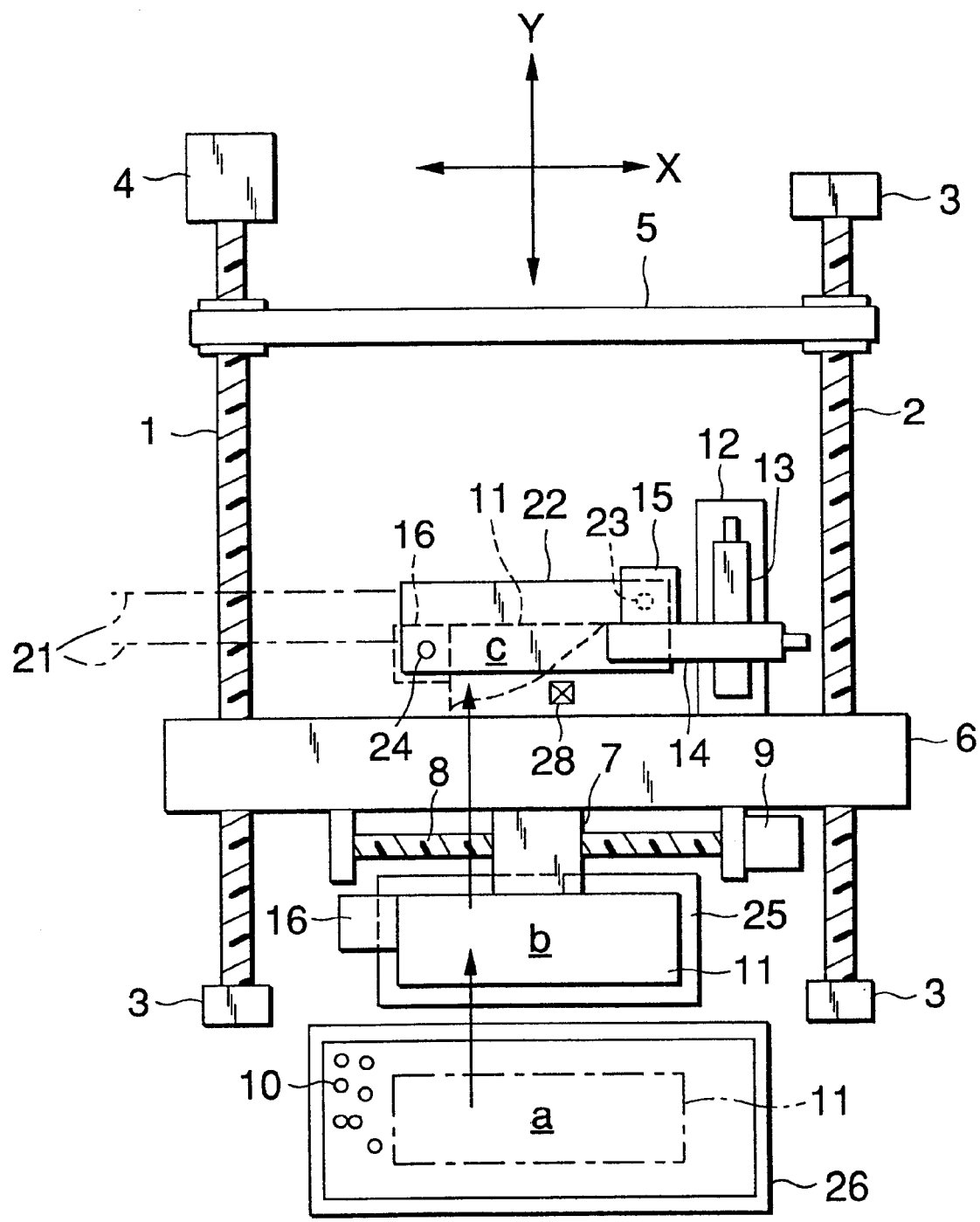
FIG. 1 is a plan view of the conductive ball attaching apparatus of Embodiment 1 of the present invention.
Figure 2:
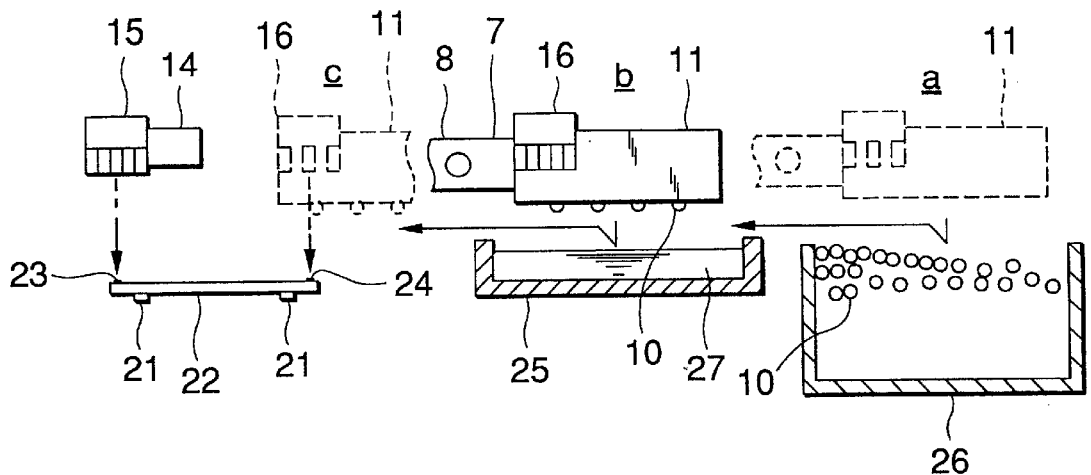
FIG. 2 is a side view of the conductive ball attaching apparatus of Embodiment 1 of the present invention.

FIG. 1 is a plan view of the conductive ball attaching apparatus of Embodiment 1 of the present invention. FIG. 2 is a side view of the conductive ball attaching apparatus of Embodiment 1 of the present invention. In FIG. 1, reference numerals 1 and 2 designate feed screws of direction Y, and the feed screw 2 is supported by the bearing 3. The feed screw 1 is driven by the motor 4. Rotation of one feed screw 1 is transmitted to the other feed crew 2 via the belt 5, so that two feed screws 1 and 2 are simultaneously rotated.

X-table 6 is mounted on the feed screws 1 and 2. The suction head 11 is held by X-table 6 via the nut section 7. The feed screw 8 of the direction X is screwed into the nut section 7. When the motor 9 is driven and the feed screw 8 is rotated, the nut section 7 is moved along the feed screw 8, so that the suction head 11 can be moved in the direction X along an imaginary horizontal plane. When the motor 4 is driven and the feed screws 1 and 2 are rotated, X-table 6 is moved along the feed screws 1 and 2, so that the suction head 11 is moved in the direction Y along the imaginary horizontal plane. That is, the components to which the reference numerals 1 to 9 are applied constitute a moving table for moving the suction head 11 in the directions X and Y along the imaginary horizontal plane.

The mount plate 12 is extended from the X-table 6. On the mount plate 12, there are provided a Y-direction moving shaft section 13 and an X-direction moving shaft section 14 which are arranged at right angles with each other. The first camera 15 is mounted on the X-direction moving shaft section 14. When the feed screws 1 and 2 are rotated, the first camera 15 on the mount plate 12 is moved in the Y-direction together with the suction head 11. When the X-direction moving shaft 14 and the Y-direction moving shaft 13 are driven, the first camera 15 can be horizontally moved in the directions X and Y irrespective of the movement of the suction head 11. That is, the Y-direction moving shaft section 13 and the X-direction moving shaft section 14 constitute a moving mechanism for moving the first camera 15 in the X-direction and the Y-direction. The second camera 16 is mounted on the side of the suction head 11. The second camera 16 is moved in the directions X and Y along the imaginary horizontal plane together with the suction head 11.

Under the movement passage of the suction head 11, the following components are arranged. Reference numeral 21 is a conveyer, which conveys the substrate 22 in the X-direction. The substrate 22 is laterally elongated, and is provided at its upper surface with a first positional recognition mark 23, which will be referred to as "point A" hereinafter, and a second positional recognition mark 24, which will be referred to as "point B" hereinafter. As described later, "point A" 23 is recognized by the first camera 15, and "point B" 24 is recognized by the second camera 16. In order to enhance the accuracy of positional recognition, "point A" 23 and "point B" 24 are generally located on the diagonal line of the substrate 22, with the distance therebetween being as large as possible. In this connection, characteristic portions of the circuit pattern may be used as "point A" 23 and "point B" 24.

A flux supply section 25 is provided adjacent to the conveyor 21. Further, a conductive ball supply section 26 is provided adjacent to the flux supply section 25. As shown in FIG. 2, the flux supply section 25 is in the form of a shallow container, in which flux 27 is stored. The conductive ball supply section 26 is in the form of a relatively deep container, in which a large number of conductive balls are stored. As shown in FIG. 1, the substrate 22 at the position where the conductive balls are to be attached, the flux supply section 25 and the conductive ball supply section 26 are juxtaposed with each other in the Y-direction. In addition, a camera position reference mark section 28 is provided adjacent to the conveyor 21 as shown in FIG. 1.

Next, operation with the conductive ball attaching apparatus thus constructed will be explained below. First, in FIGS. 1 and 2, the first camera 15 is moved to a position above the camera position reference mark section 28 to observe the camera position reference mark section 28. Next, in the same manner, the second camera 16 is moved to a position above the camera position reference mark section 28 to observe the camera position reference mark section 28. According to the results of the above two observations, a relative positional relation between the first camera 15 and the second camera 16 is found by the calculation conducted in a control section (not shown in the drawing). Then, the suction head 11 is moved to a position (position "a") above the conductive ball supply section 26. At this position, the suction head 11 is moved vertically, and a large number of conductive balls are vacuum-absorbed and picked up onto the lower surface of the suction head 11.

Next, the suction head 11 is moved to a position (position "b") above the flux supply section 25. At this position, the suction head 11 is moved vertically, so that the lower surfaces of the conductive balls 10 are dipped in the flux 27. In this way, the flux 27 is attached to the lower surfaces of the conductive balls 10. As shown in FIG. 1, the position of the first camera 15 is adjusted by the Y-direction moving shaft section 13 and the X-direction moving shaft section 14 such that the first camera 15 is located at a position above point "A" 23 of the substrate 22 if the suction head 11 is located at the position "b", Therefore, when the suction head 11 is moved to the position "b", point "A" 23 can be immediately recognized. Recognition data is inputted into the control section.

Next, the suction head 11 is moved to a position above the substrate 22. During this movement of the suction head 11 to the position above the substrate 22, the second camera 16 (provided on the side of the suction head 11) is first moved to and located at a position (position "c") above point "B" 24, so that the position of point "B" 24 is recognized. Then, the control section calculates an accurate position of the substrate 22 according to the positional recognition of points "A" 23 and "B" 24, and in accordance with the result of the calculation, the suction head 11 is moved to a position above the substrate 22. At this position, the suction head 11 is moved vertically so that the conductive balls 10 are attached to the electrodes on the substrate 22.

As described above, the conductive ball attaching apparatus is provided with the first camera 15 and the second camera 16, and during when the suction head 11 is moved to the position above the flux supply section 25 so that flux 27 is attached to the conductive balls 10, the positional recognition of point "A" 23 is conducted by the first camera 15, and further during the movement of the suction head 11 to the position above the substrate 22, the positional recognition of point "B" 24 is conducted by the second camera 16. Therefore, the positional recognition of point "A" 23 and point "B" 24, which are greatly distant from each other, can be conducted efficiently in the process of movement of the suction head 11. Accordingly, the tact time required for the positional recognition of point "A" 23 and point "B" 24 can be greatly reduced.

In this Embodiment 1, when the suction head 11 is moved to a position above the flux supply section 25, the first camera 15 is located at a position above point "A" 23. However, the following variation may be made. In FIG. 1, the flux supply section 25 is arranged 6n the opposite side to the conveyer 21, that is, in FIG. 1, the flux supply section 25 is arranged on the upside of the conveyer 21, and the conductive ball supply section 26 is arranged at the position of the flux supply section 25 shown in FIG. 1. Under this arrangement, when the suction head 11 is moved to a position above the conductive ball supply section 26 to conduct a pickup motion picking up the conductive balls 10, the first camera 15 is located at a position above point "A" 23 so as to conduct the positional recognition at the position. The important aspect of the present invention is that the two cameras 15, 16 are used and the positional recognition of point "A" 23 and point "B" 24 is conducted during the movement of the suction head 11 so that the tact time required for the positional recognition is reduced.

In this connection, there is provided a system in which flux is previously coated on the electrodes of the substrate by means of transfer. In the above system, it is unnecessary to provide the flux supply section 25. In this case, it is preferable that the first camera 15 is moved to an upper position of point "A" 23 for the positional recognition when the suction head 11 is moved to an upper position of the conductive ball supply section 26 to conduct a pickup motion picking up the conductive balls 10.

[Embodiment 2]

Figure 3:
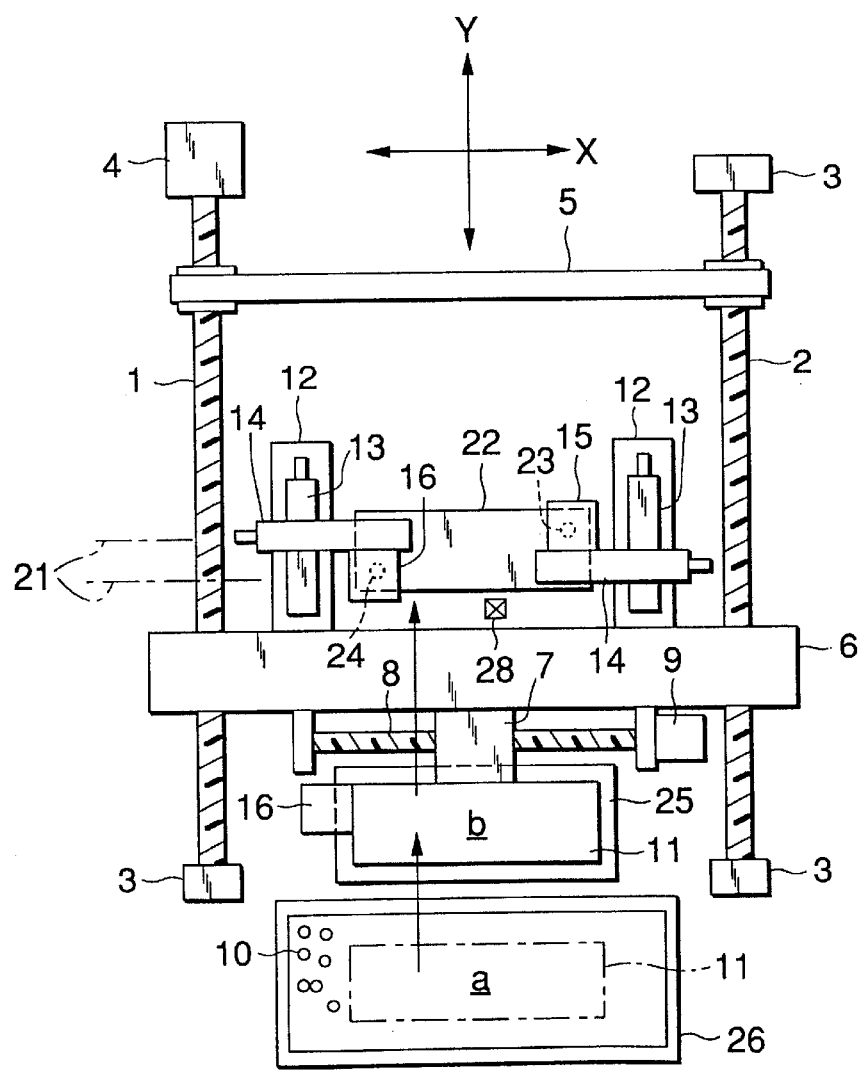
FIG. 3 is a plan view of the conductive ball attaching apparatus of Embodiment 2 of the present invention.

FIG. 3 is a plan view of the conductive ball attaching apparatus of Embodiment 2 of the present invention. In Embodiment 1, the second camera 16 is mounted on the side of the suction head 11, however, in Embodiment 2, the second camera 16 is mounted on the moving mechanism, which is constituted by the mount plate 12, Y-direction moving shaft section 13 and X-direction moving shaft section 14, in the same manner as that of the first camera 15.

Consequently, when the X-table 6 is moved in the direction Y along the feed screws 1, 2, the first camera 15 and the second camera 16 are moved in the direction Y together with the suction head 11. Also, when the Y-direction moving shaft section 13 and the X-direction moving shaft section 14 are driven, each of the first camera 15 and the second camera 16 can be moved in the directions X and Y irrespective of the movement of the suction head 11.

Therefore, when the suction head 11 is located at a position (position "b") above the flux supply section 25 as shown in FIG. 3, it is possible for the first camera 15 and the second camera 16 to recognize point "A" 23 and point "B" 24 simultaneously. Of course, positions of the first camera 15 and the second camera 16 are adjusted so that point "A" 23 and point "B" 24 can be recognized simultaneously.

[Embodiment 3]

Figure 4:
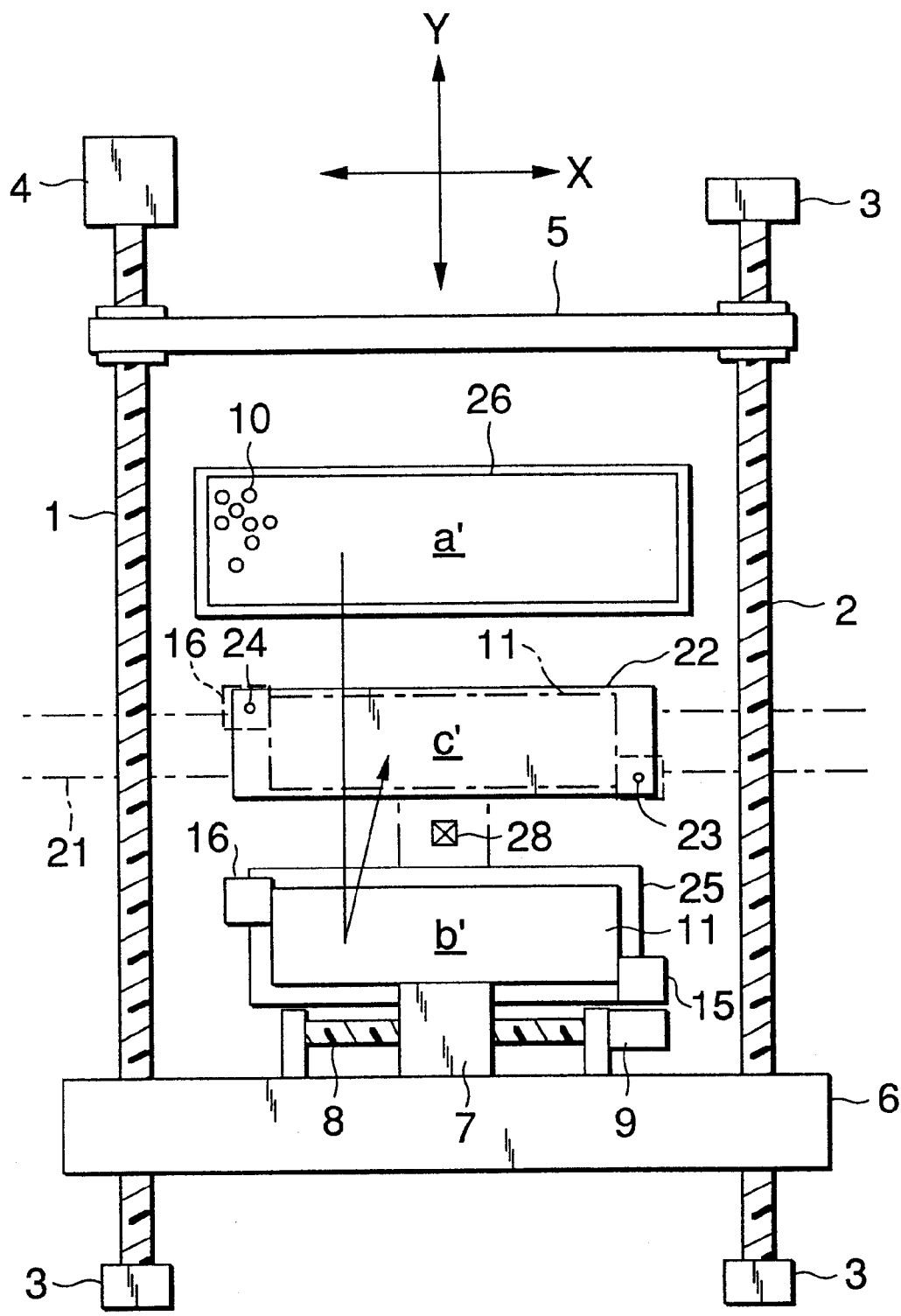
FIG. 4 is a plan view of the conductive ball attaching apparatus of Embodiment 3 of the present invention.
Figure 5:
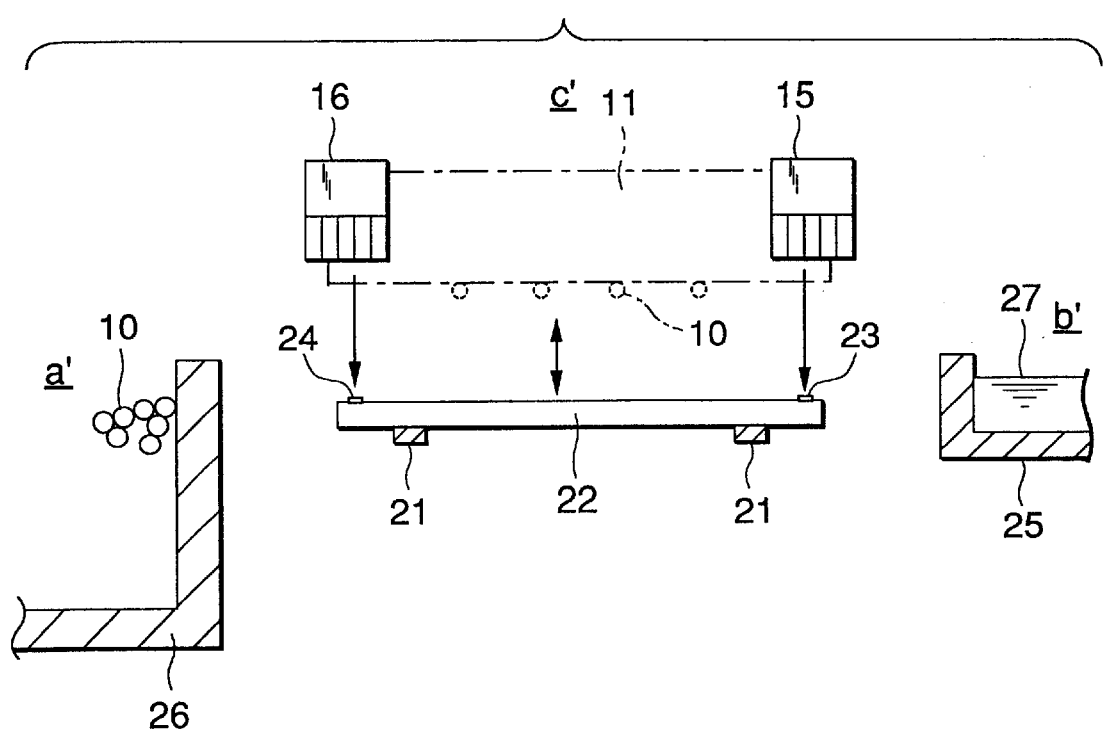
FIG. 5 is a side view of the conductive ball attaching apparatus of Embodiment 3 of the present invention.

FIG. 4 is a plan view of the conductive ball attaching apparatus of Embodiment 3 of the present invention. FIG. 5 is a side view of the conductive ball attaching apparatus of Embodiment 3 of the present invention. In this connection, the same or like components are represented by the same reference signs in Embodiments 1 and 3. In this Embodiment 3, the conveyer 21 is arranged being interposed between the flux supply section 25 and the conductive ball supply section 26. In this embodiment, point "A" 23 and point "B" 24 are arranged on a diagonal line which is different from the diagonal line where point "A" 23 and point "B" 24 are provided in the arrangement of Embodiment 1. The first camera 15 and the second camera 16 are respectively arranged on both sides of the suction head 11, so that these cameras can be moved in the directions X and Y along the imaginary horizontal plane together with the suction head 11.

Next, operation will be explained below. First, the camera position reference mark 28 is observed by the first camera 15 and the second camera 16, and a positional relation between the first camera 15 and the second camera 16 is previously recognized. Then, the suction head 11 is moved to a position (position a') above the conductive ball supply section 26. Next, the suction head 11 is moved vertically to absorb and pick up the conductive balls 10 by the action of vacuum. Next, the suction head 11 is moved to a position (position b') above the flux supply section 25. When the suction head 11 is moved vertically at this position, flux 27 is attached onto the lower surfaces of the conductive balls 10.

Next, the suction head 11 is moved to a position (position c') above the substrate 22, where the first camera 15 recognizes point "A" 23, and then the second camera 16 recognizes point "B" 24. In accordance with the positional recognition at point "A" 23 and point "B" 24, the control unit calculates an accurate position of the substrate 22, and in accordance with the result of the calculation, the suction head 11 is slightly moved in the directions of X and Y so that the suction head 11 is accurately positioned with respect to the substrate 22. Then, the suction head 11 is moved vertically, so that the conductive balls 10 are attached onto the electrodes of the substrate 22.

As described above, in this Embodiment 3, the positional recognition of point "A" and point "B" can be quickly conducted by the first camera 15 and the second camera 16, and thus the conductive balls 10 can be attached onto the substrate 22 with high workability.

What is claimed is:

1. A conductive ball attaching apparatus for picking up and conveying a plurality of conductive balls and attaching the conductive balls onto electrodes of a substrate, said conductive ball attaching apparatus comprising:

a first positional recognition mark on said substrate;

a second positional recognition mark on said substrate, wherein said first and second positional recognition marks are spaced distant from each other;

a conductive ball attaching section where the substrate is to be placed;

a conductive ball supply section where the conductive balls are provided;

a suction head movable between the conductive ball attachment section and the conductive ball supply section along an imaginary horizontal plane;

a first camera associated with the suction head and movable, along the imaginary horizontal plane, to a position above the first positional recognition mark of the substrate placed at the conductive ball attaching section; and a second camera associated with the suction head and movable, along the imaginary horizontal plane, to a position above the second positional recognition mark of the substrate placed at the conductive ball attaching section.

2. A conductive ball attaching apparatus according to claim 1, further comprising:

a moving table for moving the suction head along the imaginary horizontal plane.

3. A conductive ball attaching apparatus according to claim 2, wherein the moving table includes:

a first table movable in a first direction along the imaginary horizontal plane, and supporting the first camera; and a second table supported by the first table and movable relative to the first table in a second direction perpendicular to the first direction along the imaginary horizontal plane, the second table supporting the suction head.

4. A conductive ball attaching apparatus according to claim 3, wherein when said first table is moved in the first direction to move the suction head in the first direction, the first camera is moved in the first direction together with the suction head.

5. A conductive ball attaching apparatus according to claim 3, wherein the second camera is mounted on the suction head.

6. A conductive ball attaching apparatus according to claim 3, wherein the second camera is supported by the first table.

7. A conductive ball attaching apparatus according to claim 2, wherein the first and second cameras are mounted on the suction head.

8. A conductive ball attaching apparatus according to claim 7, wherein when the suction head is moved in a first direction along the imaginary horizontal plane by the moving table, the first camera is moved in the first direction together with the suction head, and when the suction head is moved in a second direction perpendicular to the first direction along the imaginary horizontal plane by the moving table, the first camera is moved in the second direction together with the suction head.

9. A conductive ball attaching apparatus according to claim 3, wherein the first camera is supported by the first table through a first camera moving mechanism.

10. A conductive ball attaching apparatus according to claim 9, wherein the second camera is supported by the first table through a second camera moving mechanism.

11. A conductive ball attaching apparatus according to claim 1, further comprising:

a conveyor for conveying the substrate.

12. A conductive ball attaching apparatus comprising:

a conveyer for conveying a substrate having two positional recognition marks distant from each other;

a conductive ball supply section arranged adjacent to the conveyor for supplying conductive balls;

a suction head for vacuum-absorbing and picking up the conductive balls accommodated in the conductive ball supply section, and conveying and attaching the conductive balls onto the substrate;

a moving table for moving the suction head along an imaginary horizontal plane; and first and second cameras for observing the two positional recognition marks, each of said first and second cameras being movable in at least one direction along the imaginary horizontal plane together with the suction head when the suction head is driven by the moving table.

13. A conductive ball attaching apparatus according to claim 12, wherein the moving table includes:

a first table movable in a first direction along the imaginary horizontal plane; and a second table supported by the first table and movable relative to the first table in a second direction perpendicular to the first direction along the imaginary horizontal plane, the second table supporting the suction head.

14. A conductive ball attaching apparatus according to claim 13, wherein the first camera is supported by the first table, and the second camera is mounted on the suction head.

15. A conductive ball attaching apparatus according to claim 13, wherein the first and second cameras are supported by the first table.

16. A conductive ball attaching apparatus according to claim 13, wherein the first and second cameras are mounted on the suction head.

17. A conductive ball attaching apparatus for picking up and conveying a plurality of conductive balls and attaching the conductive balls onto electrodes of a substrate, said conductive ball attaching apparatus comprising:

a first positional recognition mark on said substrate;

a second positional recognition mark on said substrate, wherein said first and second positional recognition marks are spaced distant from each other;

a conductive ball attaching section where the substrate is to be placed;

a conductive ball supply section where the conductive balls are provided;

a suction head movable between the conductive ball attachment section and the conductive ball supply section;

a first camera associated with the suction head and movable to a position above the first positional recognition mark of the substrate placed at the conductive ball attaching section; and a second camera associated with the suction head and movable to a position above the second positional recognition mark of the substrate placed at the conductive ball attaching section.

18. A conductive ball attaching apparatus according to claim 17, wherein the first camera is movable relative to the substrate so that the first camera can be aligned with the first positional recognition mark.

19. A conductive ball attaching apparatus according to claim 17, wherein the second camera is movable relative to the substrate so that the second camera can be aligned with the second positional recognition mark.

20. A conductive ball attaching apparatus according to claim 17, wherein said apparatus includes a conveyor for transporting said substrate into and out of said conductive ball attaching section.

21. A conductive ball attaching apparatus according to claim 17, wherein at least one of said first and second cameras is movable independent of movement of said suction head.

22. A conductive ball attaching apparatus according to claim 21, wherein at least one of said first and second cameras is mounted for common movement with said suction head.

23. A conductive ball attaching apparatus according to claim 17, further comprising:

a first table and a second table, said first table being movable in a first direction and supporting said first camera, said second table being supported by the first table and being movable relative to the first table in a second direction transverse to the first direction, said second table supporting the suction head.

24. A conductive ball attaching apparatus according to claim 23, wherein, when the first table is moved in the first direction to move the suction head in the first direction, the first camera is moved in the first direction together with the suction head.

25. A conductive ball attaching apparatus according to claim 24, wherein the second camera is supported by the first table.

26. A conductive ball attaching apparatus according to claim 24, wherein the second camera is secured to the suction head.

27. A conductive ball attaching apparatus according to claim 23, wherein the first camera is supported by the first table via a first camera moving mechanism and the second camera is supported by the first table via a second camera moving mechanism.

* * * * *